(12) United States Patent
Petsch et al.

(10) Patent No.: US 10,237,984 B2
(45) Date of Patent: Mar. 19, 2019

(54) METHOD AND INSTALLATION FOR PRODUCING A MULTILAYER ELEMENT AND MULTILAYER ELEMENT

(71) Applicant: 3D-Micromac AG, Chemnitz (DE)

(72) Inventors: Tino Petsch, Chemnitz (DE); Maurice Clair, Plauen (DE); Alexander Böhm, Marienburg (DE); Martin Sachse, Chemnitz (DE)

(73) Assignee: 3D-Micromac AG (DE)

( * ) Notice: Subject to any disclaimer, the term of this patent is extended or adjusted under 35 U.S.C. 154(b) by 582 days.

(21) Appl. No.: 14/404,808

(22) PCT Filed: May 27, 2013

(86) PCT No.: PCT/EP2013/060878
§ 371 (c)(1),
(2) Date: Dec. 1, 2014

(87) PCT Pub. No.: WO2013/178588
PCT Pub. Date: Dec. 5, 2013

(65) Prior Publication Data
US 2015/0144379 A1  May 28, 2015

(30) Foreign Application Priority Data

Jun. 1, 2012 (DE) .................. 10 2012 209 328

(51) Int. Cl.
*H05K 3/46* (2006.01)
*H05K 3/04* (2006.01)
(Continued)

(52) U.S. Cl.
CPC ..... *H05K 3/4652* (2013.01); *G06K 19/07779* (2013.01); *H01Q 1/2225* (2013.01);
(Continued)

(58) Field of Classification Search
CPC ...... H05K 3/4652; H05K 3/027; H05K 3/046; H05K 3/22; H05K 3/26; H05K 3/048;
(Continued)

(56) References Cited

U.S. PATENT DOCUMENTS 5,124,927 A * 6/1992 Hopewell ........... G03F 7/70558
250/491.1
5,555,316 A 9/1996 Tsujikawa et al.
(Continued)

FOREIGN PATENT DOCUMENTS

| CN | 1360736 | 7/2002 |
|---|---|---|
| CN | 1425209 | 6/2003 |

(Continued)

OTHER PUBLICATIONS

German Search Report dated Apr. 19, 2013 corresponding to German Priority Application 10 2012 209 328.1.
First Office Action dated Feb. 27, 2017, of corresponding Chinese Application No. 201380040958.7 in English.

*Primary Examiner* — Peter DungBa Vo
*Assistant Examiner* — Azm Parvez
(74) *Attorney, Agent, or Firm* — DLA Piper LLP (US)

(57) ABSTRACT

A method produces a multilayer element with a substrate and at least one conductor structure connected in an areal manner to the substrate, which has first regions of electrically conductive material, which is present in accordance with a prescribed pattern, while electrically non-conductive second regions lie between the first regions.

12 Claims, 8 Drawing Sheets

(51) Int. Cl.
*G06K 19/077* (2006.01)
*H05K 3/02* (2006.01)
*H01Q 1/22* (2006.01)
*H05K 3/22* (2006.01)
*H05K 3/26* (2006.01)
*H05K 1/02* (2006.01)

(52) U.S. Cl.
CPC ........... *H05K 1/0298* (2013.01); *H05K 3/027* (2013.01); *H05K 3/046* (2013.01); *H05K 3/22* (2013.01); *H05K 3/26* (2013.01); *H05K 1/0269* (2013.01); *H05K 3/048* (2013.01); *H05K 2203/0278* (2013.01); *H05K 2203/0522* (2013.01); *H05K 2203/0525* (2013.01); *H05K 2203/0528* (2013.01); *H05K 2203/06* (2013.01); *H05K 2203/081* (2013.01); *H05K 2203/085* (2013.01); *H05K 2203/107* (2013.01); *H05K 2203/1545* (2013.01); *Y10T 29/49128* (2015.01); *Y10T 156/108* (2015.01); *Y10T 156/1052* (2015.01)

(58) Field of Classification Search
CPC .. H05K 1/0298; H05K 1/0269; H01Q 1/2225; Y10T 29/49128; Y10T 29/49124; Y10T 29/49117; Y10T 29/49002
USPC ............... 29/831, 829, 825, 592.1, 832, 830
See application file for complete search history.

(56) References Cited

U.S. PATENT DOCUMENTS

| | | | |
|---|---|---|---|
| 5,759,422 | A | 6/1998 | Schmelzer et al. |
| 5,800,724 | A | 9/1998 | Habeger et al. |
| 6,280,555 | B1 | 8/2001 | Wilbur |
| 6,320,556 | B1 | 11/2001 | Cyman et al. |
| 7,105,915 | B1 | 9/2006 | Finn et al. |
| 7,930,822 | B2 * | 4/2011 | Nakanishi .............. H05K 3/046 |
| | | | 156/233 |
| 2001/0044013 | A1 | 11/2001 | McDonough et al. |
| 2005/0034995 | A1 | 2/2005 | Gundlach et al. |
| 2005/0067703 | A1 | 3/2005 | Hashimoto |
| 2006/0216861 | A1 | 9/2006 | Nakagawa |
| 2007/0062639 | A1 | 3/2007 | Chang et al. |
| 2009/0297300 | A1 | 12/2009 | Brod |
| 2011/0005821 | A1 * | 1/2011 | Marttila ................. B32B 38/10 |
| | | | 174/258 |

FOREIGN PATENT DOCUMENTS

| | | |
|---|---|---|
| CN | 1692496 | 11/2005 |
| DE | 697 34 328 T2 | 7/2006 |
| DE | 10 2006 002 367 B3 | 10/2007 |
| DE | 10 2009 001 221 A1 | 9/2012 |
| EP | 0 790 123 B1 | 8/1997 |
| WO | 2009/118455 A1 | 10/2009 |
| WO | 2011/159716 A1 | 12/2011 |

* cited by examiner

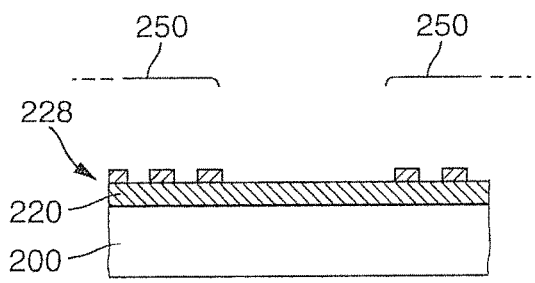
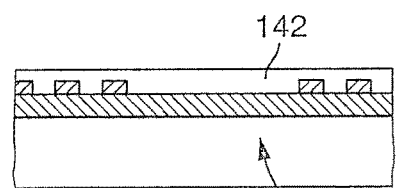
Fig. 10A  Fig. 10B
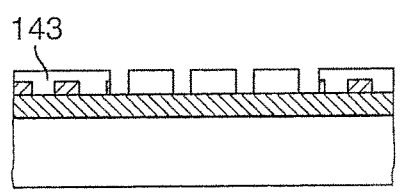
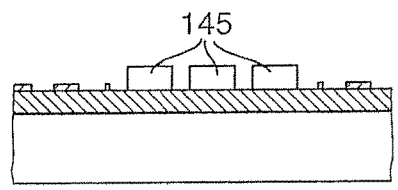
Fig. 10C  Fig. 10D
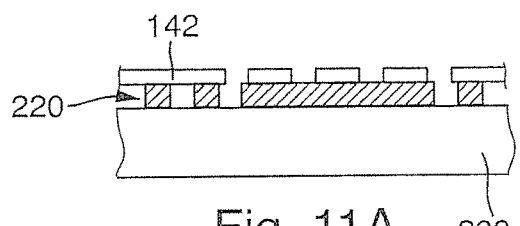
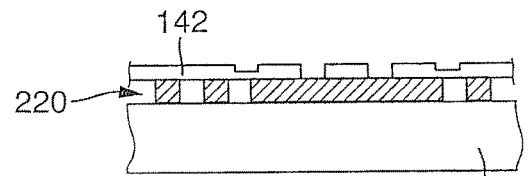
Fig. 11A  Fig. 12A
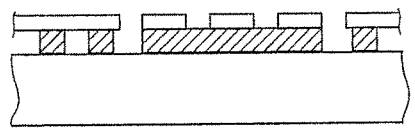
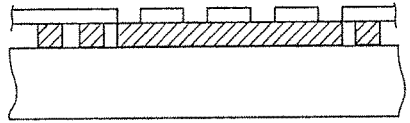
Fig. 11B  Fig. 12B
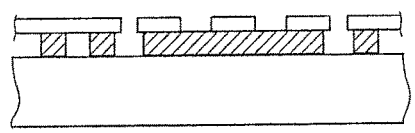
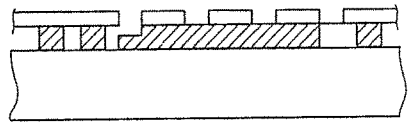
Fig. 11C  Fig. 12C
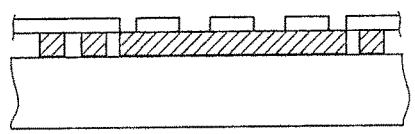
Fig. 11D

METHOD AND INSTALLATION FOR PRODUCING A MULTILAYER ELEMENT AND MULTILAYER ELEMENT

TECHNICAL FIELD

This disclosure relates to a method of producing a multilayer element with a substrate and at least one conductor structure connected in an areal manner to the substrate, to an installation that produces such a multilayer element and to a multilayer element that can be obtained by the method.

A preferred field of application is the production of antennas for radio-frequency identification systems (RFID antennas) or other multilayer elements that can be produced by lamination and have conductive structures, for example, for electrical circuits, by using flexible substrates in strip form in a roller-to-roller process.

BACKGROUND

In the production of electrical or electronic components for mass applications, it is endeavored to provide the desired electrical functionality in good quality with the lowest possible production costs. In one class of production methods, a laminate is produced as an intermediate product by a conductor foil, in particular a metal foil, being connected to the substrate by a layer of adhesive lying in between. Subsequently, the conductor foil is structured, by being severed by a suitable separating process, for example, laser cutting, punching or the like, at the boundaries of those regions that are intended to later form the conductor structure. In many cases, this involves creating relatively large pieces of foil that do not belong to the end product and accordingly have to be removed from the intermediate product before further method steps can follow.

EP 0 790 123 B1 and corresponding DE 697 34 328 T2 describe a method of producing a laminate from a patterned metal foil and a substrate in which a metal foil web is laminated onto a substrate by an adhesive being introduced between the metal foil and the substrate in a predetermined pattern. The pattern defines regions in which adhesive is present and regions in which no adhesive is present. Subsequently, the metal foil is cut into a pattern, which corresponds to the boundaries of the regions containing the adhesive. The cutting may take place, for example, by rotational punching or by laser cutting. Those regions of metal foil that are not adhesively attached to the substrate by the adhesive are subsequently removed, for example, by suction.

WO 2009/118455 A1 discloses other methods of the generic type. In one variant of the method, a conductor foil is selectively fastened to the substrate material, desired regions of the end product that form the final conductor structure and narrow regions between the conductive regions of the end product being connected to the substrate by an adhesive, and laterally extended regions of the foil intended to be removed later remain, largely unconnected to the substrate such that they are at most connected to the substrate in a peripheral region removed in a later structuring step. Subsequently, the conductor foil is structured by material removal, by removing material from narrow regions between the desired regions of the conductor structure and from the outer periphery of the larger foil regions intended to be removed from the piece later to create the conductor structure. After that, the pieces of foil that are no longer fastened to the substrate are removed since the peripheral region of these pieces of foil that was removed from the outer periphery of these pieces of foil during the structuring operation no longer securely holds the pieces of foil on the substrate. Among the aims of the method is to avoid problems that arise when adhesive material remains in the non-conductive regions of the finished structure.

It could therefore be helpful to provide a method and an installation that produces a multilayer element of the generic type that allow the production of high-quality multilayer elements with a high degree of reliability of the process at low production costs. The end products produced should have consistently good functionality even under mechanical loading during use.

SUMMARY

We provide a method of producing a multilayer element with a substrate and at least one conductor structure connected in an areal manner to the substrate, which has first regions of electrically conductive material, which is present in accordance with a prescribed pattern, while electrically non-conductive second regions lie between the first regions including connecting a conductor foil to the substrate such that the conductor foil firmly connects to the substrate in the first regions and a partial bonding contact between the substrate and the conductor foil is created at a multiplicity of bonding zones in laterally extended second regions, structuring the conductor foil by cutting the conductor foil along boundaries of the first regions, and removing contiguous pieces of foil of the conductor foil from laterally extended second regions by releasing the partial bonding contact between the substrate and the conductor foil.

We also provide an installation that produces a multilayer element with a substrate and at least one conductor structure connected in an areal manner to the substrate, which has first regions of electrically conductive material, which is present in accordance with a prescribed pattern, while electrically non-conductive second regions lie between the first regions, including device that connect a conductor foil to the substrate such that the conductor foil firmly connects to the substrate in the first regions and a partial bonding contact between the substrate and the conductor foil exists at a multiplicity of bonding zones in laterally extended second regions, a device that structures the conductor foil by cutting the conductor foil along boundaries of the first regions, and a cleaning device that removes pieces of foil of the conductor foil from laterally extended second regions by releasing the partial bonding contact between the substrate and the conductor foil.

We further provide a multilayer element produced by the method of producing a multilayer element with a substrate and at least one conductor structure connected in an areal manner to the substrate, which has first regions of electrically conductive material, which is present in accordance with a prescribed pattern, while electrically non-conductive second regions lie between the first regions including connecting a conductor foil to the substrate such that the conductor foil firmly connects to the substrate in the first regions and a partial bonding contact between the substrate and the conductor foil is created at a multiplicity of bonding zones in laterally extended second regions, structuring the conductor foil by cutting the conductor foil along boundaries of the first regions, and removing contiguous pieces of foil of the conductor foil from laterally extended second regions by releasing the partial bonding contact between the substrate and the conductor foil.

BRIEF DESCRIPTION OF THE DRAWINGS

FIG. 10 schematically shows various production steps in an example with application of adhesive over the full surface area and subsequent local covering of intermediate regions.

FIG. 11 shows various variants of the laser structuring in different variants of applying an adhesive substance.

FIG. 12 shows various variants of the laser structuring of a layer of conductor material with differing structuring depths.

DETAILED DESCRIPTION

Figure 1:
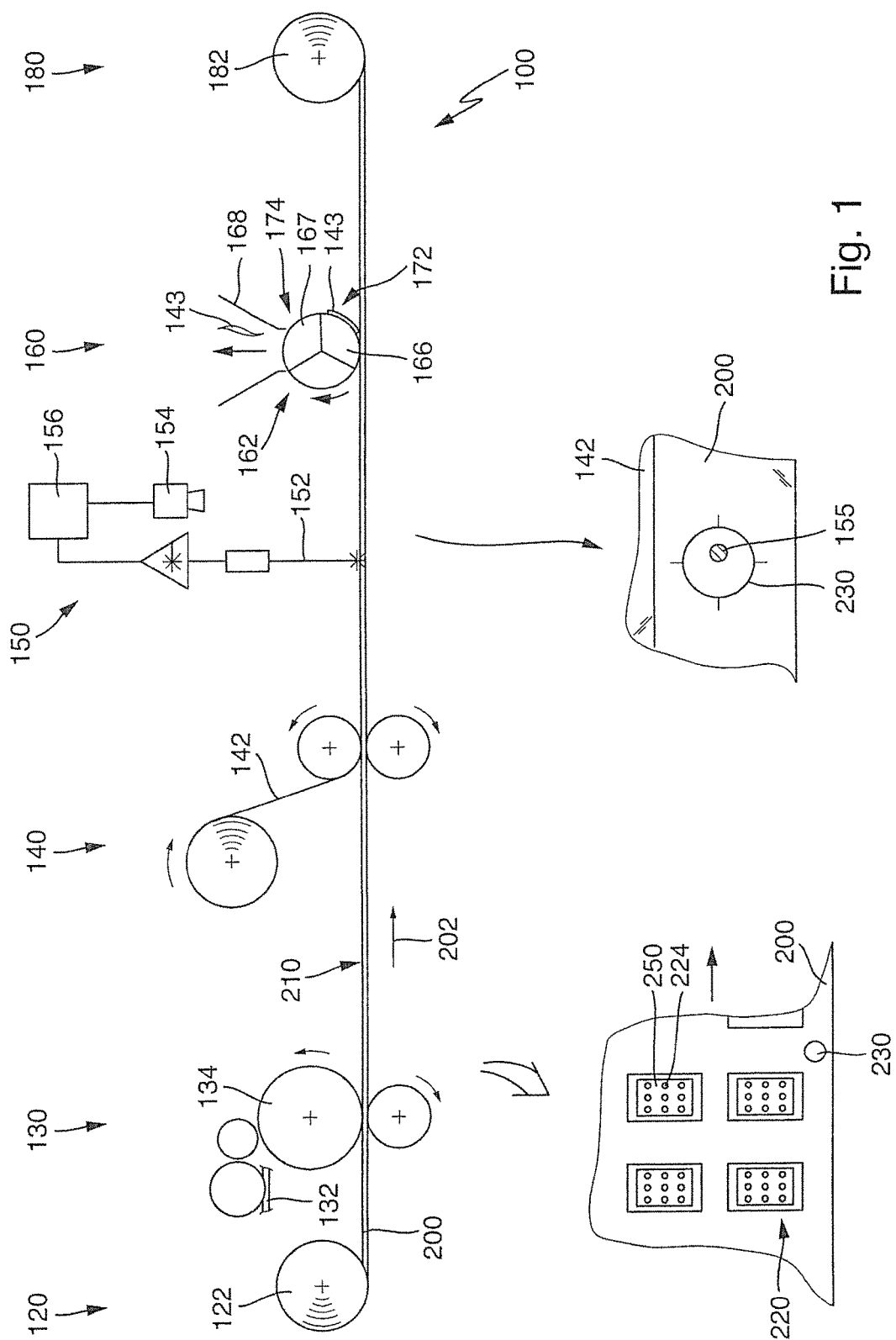
FIG. 1 shows a schematic view of an example of an installation that produces multilayer elements with a laminate structure according to one example and also two associated representations of details.

In the method, the conductor foil connects to the substrate by the conductor foil firmly bonding to the substrate in first regions, which in the end product are intended to have the desired electrically conductive conductor material, and a partially bonding contact between the substrate and the conductor foil being created in laterally extended second regions, which are intended to be electrically non-conductive on the end product, at a multiplicity of bonding zones distributed over the extended second region. "Bonding zones" are generally relatively small in surface area and are at a lateral distance from one another in at least one direction lying in the surface area. Lying between bonding zones are intermediate regions in which there is no bonding force or only greatly reduced bonding force compared to the bonding zones. The firm bonding in the first regions can be achieved in particular by an areal, uninterrupted connection between the substrate and the conductor foil being established here.

After that, the conductor foil is structured by cutting or separating the conductor foil along boundaries of the first regions, whereby those regions that form the desired conductor structure on the finished product are machined out from the previously contiguous conductor foil. In this structuring operation, pieces of foil of the conductor foil that adjoin the regions with the conductor structure remain in laterally extended second regions. In the laterally extended second regions, these pieces of foil are initially still attached to the substrate or the layer of adhesive in the region of the bonding zones distributed in accordance with a prescribed pattern. After the structuring operation, the pieces of foil are removed from the laterally extended second regions, the partial bonding contact between the substrate and the conductor foil in the region of the bonding zones being released.

A "laterally extended second region" typically has in a number of directions an extent that is greater by a multiple than the cut width of the structuring operation, for example, at least 10 times or at least 100 times or at least 1000 times as great. The extent of laterally extended regions may, for example, be at least 1 mm at the narrowest location and/or at least 10 mm at the widest location. For example, in conductor structures uninterrupted in the circumferential direction, as are occasionally used for antennas or coils, laterally extended second regions may lie in the interior of the conductor structure. Greater laterally extended second regions may also lie between conductor structures that lie adjacently at a distance from one another on the same substrate. There are generally also second regions of smaller lateral dimensions, for example, between closely adjacently extending conductor tracks of the conductor structure. In these second regions, the conductor material may be already removed in the structuring operation, for example, by laser ablation (material removal by laser radiation).

With the proposed way of conducting the method, problems that arise due to undefined detachment of pieces of foil that are not required can be reliably avoided. In the production of multilayer elements of the generic type by known laminating methods it has occasionally proven to be difficult to remove the excess foil material cleanly and without adversely affecting the production sequence. In particular, it has sometimes been difficult to remove the conductor material such as, for example, a metal foil at a precisely defined position in the process chain at a precisely defined point in time during the process sequence. Among the risks entailed by uncontrolled detachment of pieces of foil is that the periphery of the pieces of foil to be removed frays during the structuring or covers over regions still to be machined and, consequently, the production process is disturbed. Such problems are avoided in our method since, in the laterally extended second regions which on the finished product are intended to no longer have any conductor material, the conductor foil initially still remains connected to the substrate at the bonding zones.

The partial, locally restricted bonding contact at many distributed locations within the extended second regions brings about a well-definable ultimate bonding force, with which pieces of foil cut free are initially still securely held on the substrate. This bonding force may be adapted within wide limits to the process underway at the time by prescribing the number, size, form and/or distribution of the bonding zones within the second regions to ensure that the bonding force in the second region is much lower than the bonding force with which the conductor foil bonds to the substrate in first regions, for forming the conductor structure. As a result, a chance detachment of cut-free pieces of foil or a displacement of such pieces of foil occurring while the structuring of the conductor foil is still in progress is reliably avoided. Only when sufficiently strong forces act on the pieces of foil during the later removal of the pieces of foil can they be detached from the bonding zones and, consequently, released. The partial attachment of the cut-free pieces of foil at the bonding zones in the extended second regions also has the effect of ensuring that the material cannot get into the installation in an undefined manner, and possibly cause disturbances there, before the step of the defined removal from the substrate.

In examples in which a layer of adhesive lying in between is used to connect the substrate and the conductor foil, it is also possible to produce laminated multilayer elements (laminates) having a mechanical load-bearing capacity sufficient for the intended use both in the regions of the conductor structure and in the electrically non-conductive second regions. In conventionally produced laminates it may be that on the end product the electrically non-conductive second regions are mechanically much less stable, and much less able to withstand loads, than those first regions in which the conductor structure bonds to the substrate. As a consequence, difficulties may arise in further processing. If, for example, a transponder element with a flexible RFID antenna is fastened to a piece of clothing, the less stable region without the conductor structure generally entails the highest risk of permanent, dynamic material fatigue, with the consequence of crack formation or rupture, and in the end possibly functional inoperability of the RFID antenna. This may result in a restricted lifetime. If, on the other hand, on the finished product regions with a layer of adhesive are still present in the second regions, a mechanical stabilization of the second regions may be obtained as a result.

The method may be carried out such that the bonding zones in laterally extended second regions form a uniform or non-uniform pattern of points or a uniform or non-uniform pattern of lines. In many variants, the spatial distribution of bonding zones is substantially uniform, but may also be non-uniform so that, for example, between regions of a higher spatial density of bonding zones there are more easily detachable regions of a lower density of bonding zones. The bonding zones often have in at least one direction a lateral extent that is less than the lateral distance between adjacent bonding zones in the corresponding direction. Point-formed bonding zones are not point-formed in the mathematical sense, but have a lateral extent and a corresponding position to provide the desired bonding force locally within the second regions. Point-formed bonding zones are surrounded on all sides in the circumferential direction by intermediate regions that are not able to bond, or only slightly. Point-formed bonding zones may, for example, have a round, oval or polygonal cross section. Linear bonding zones may lie parallel to one another or cross one another, for example, to form a grid-like rectangular pattern or a rhomboidal pattern. The line width of linear bonding zones may be uniform or vary along the line. The area fraction of the bonding zones within the laterally extended regions, i.e., the ratio between the total area of the bonding zones in a laterally extended second region and the total area of the laterally extended second region, can be set according to requirements. In typical examples, the area fraction is about 2% to about 80%, in particular about 5% to about 50%. The total area of the intermediate regions that do not bond, or only poorly, is therefore generally greater than that of the bonding zones.

Preferably, the conductor foil connects to the substrate by a layer of adhesive lying in between. A corresponding installation has for this purpose at least one adhesive applying device. The connection by an adhesive or adhesive substance is in many cases particularly harmless for the substrate and the conductor foil. Furthermore, the connection can generally be established at relatively low cost with high productivity. Alternatively or in addition, suitable other connecting techniques may be used.

There are various possibilities to create the layer of adhesive.

In some examples, before connecting the conductor foil to the substrate, a laterally structured layer of adhesive is applied to the substrate or to the conductor foil, adhesive being applied over the full surface area in the first regions and partially, in accordance with a prescribed pattern, in laterally extended second regions, to create the bonding zones. No adhesive is applied between the regions that form the bonding zones so that there the conductor foil or the substrate remains free of adhesive during the application of adhesive. This procedure is distinguished by particularly low consumption of adhesive.

To create a laterally structured layer of adhesive, a jet printing process analogous to inkjet printing may be used, for example. This digital printing process offers a high degree of flexibility in the design of the laterally structuring pattern of adhesive to be applied and can be used particularly when using adhesives of low viscosity. If appropriate, adhesives may be diluted for this purpose. A pattern of adhesive substance may also be applied by a flexographic printing process, that is to say by a web-fed rotary printing process, in which a flexible printing plate with a raised pattern can be used to apply the adhesive. The flexible stamping roller rolls on the material to be printed (substrate or conductor foil) and thereby creates the desired pattern of adhesive. This variant of the method of applying adhesive may be economically advantageous, particularly in series with very large numbers of items. Alternatively, the adhesive may also be applied by a screen printing process or an offset printing process with suitable lateral distribution, if appropriate also by slot-die coating or by intaglio printing processes, for example, gravure printing.

As an alternative or in addition to the direct creation of a laterally structured layer of adhesive, in other variants of the method it is provided that, before connecting the conductor foil to the substrate, in a first partial operation (adhesive applying operation) a layer of adhesive is applied to the substrate or the conductor foil over the full surface area, i.e., in the first and second regions, and after that, in a second partial operation, intermediate regions of the layer of adhesive with reduced bonding force, or without any bonding force, are created by a post-treatment within the laterally extended second regions between the bonding zones provided.

For this purpose, in some variants of the method a covering layer is applied in a locally restricted manner in the intermediate regions between the bonding zones as a further layer to the layer of adhesive or the corresponding position on the surface of the conductor foil in accordance with a prescribed pattern. For example, the regions lying between the bonding zones may be covered with a lacquer, for example, a UV lacquer or an ink, for example, a UV ink. The material of the laterally structured covering layer may be applied in the desired pattern by a suitable printing process, for example, a jet printing process or a flexographic printing process.

To reduce the bonding force, it is also possible to convert the adhesive in the intermediate regions between the bonding zones chemically and/or physically by exposure to corresponding agents such that the bonding force is reduced. For example, the intermediate regions may be irradiated by a laser or some other electromagnetic radiation. For example, it is possible by laser radiation to reduce the adhesive in its adhesive force in certain regions (locally), by the thermal energy introduced causing a chemical conversion of the adhesive substance. Alternatively or in addition, the intermediate regions may also be chemically treated locally, for example, with a liquid or solid substance such as an ink, a powder or the like.

It is also possible to partially or completely remove the intermediate regions between the bonding zones mechanically by a laser or in some other way so that all that remains of an original full-area layer of adhesive are the regions of the bonding zones for the adhesive contact. The adhesive material may, for example, be removed in the intermediate regions by laser ablation. For example, the thickness of the layer of adhesive may be reduced in certain regions such that, although a full-area layer of adhesive remains, the differing, locally varying thickness means that the adhesive force is correspondingly of varying intensity.

When using an adhesive that first has to be converted from a non-adhering state, or a weakly adhering state, into a state with a great bonding force by exposure to external influences, for example, irradiation with UV radiation, the bonding zones may also be created by first applying the initially still inactive or only weakly adhering adhesive over the full surface area and then only activating the regions of the bonding zone locally by corresponding exposure.

In some variants of the method, a drying operation takes place after the application of adhesive or a post-treatment of the layer of adhesive, for example, to transform a relatively liquid adhesive quickly into a state of high viscosity more favorable for further processing and/or to dry a later applied ink, a lacquer or some other covering liquid. In the drying operation, ultraviolet radiation and/or infrared radiation, for example, may be radiated onto the layer of adhesive. It is also possible to dry the layer of adhesive and/or a covering layer applied only in the intermediate regions by microwaves and/or by increasing the temperature or by vaporizing volatile constituents by negative pressure (vacuum drying).

In a subsequent laminating operation, the conductor foil may be connected in an areal manner to the substrate. The laterally structured layer of adhesive may be located on the side of the conductor foil facing the substrate or on the side of the substrate facing the conductor foil. It would also be possible that some portions of the area of a structured layer of adhesive are attached to one of the components (conductor foil or substrate), while other sub-regions are attached to the other component, the respective sub-layers then supplementing one another during the lamination to form the desired layer of adhesive.

To be able to carry out the successive method steps during the production of structured laminates as far as possible without positioning errors, register marks may be provided at a suitable location of the substrate, for example, to the left and/or to the right of the region later to be laminated with conductor foil. Register marks may be created, for example, by printing, lasering, scoring or the like. In one variant of the method, portions of register marks consisting of adhesive are created on the substrate simultaneously with the application of adhesive. If such portions of register marks are applied in the same process step as the adhesive, the relative position of the zones of adhesive in relation to the register marks can be prescribed particularly exactly, which has a positive effect on the positioning accuracy of the structures to be produced later. The register marks may, for example, be created by a printing unit to apply the adhesive for the lamination being used at the same time to print portions of the register marks. These adhering portions of register marks may be subsequently subjected to at least one further treatment step to deactivate the adhesive and/or make it visible for a later optical detection of the register marks. For example, the adhering portion of the register marks may be subsequently sprinkled or coated with colored powder or toner. The applied particles may bond in the region of the adhesive, bind its adhering properties and at the same time provide the necessary contrast for a later optical detection, for example, by a camera.

For the structuring of the conductor foil, various separating processes or cutting processes may be used, for example, punching processes or mechanical cutting processes. Preferably, the structuring of the conductor foil takes place by radiating laser radiation along the boundaries of the second regions, that is to say by a suitable process of laser machining. In such cases, the installation comprises a corresponding laser machining system. It may be, for example, a scanner system or a mask projection system.

One problem with laser machining is that of radiating a laser beam as positionally accurately as possible, and with a defined beam quality, under differing operating conditions onto the surface regions respectively to be machined. This is particularly difficult in substrates that are moved during the machining, for example, in roller-to-roller processes. If there are errors in positioning accuracy, it may be that the conductor structures to be created do not have the desired form with the required accuracy. Since, depending on the system setup, positioning tolerances are generally not completely avoidable and it may also happen that the laser beam drifts away over the course of time, for example, due to thermal heating of components for beam guiding and beam shaping, positional deviations should be detected, and if appropriate compensated, as far as possible during the process (in process, on-the-fly). In one example, a self-calibration of the laser machining system is provided for this purpose, comprising the following steps: creating at least one laser marking in the region of a register mark provided on the substrate; detecting in a spatially resolving manner the region of the register mark and of the laser marking for the determination of a relative deviation of the laser marking in relation to the register mark; determining at least one deviation parameter that represents the relative position of the laser marking in relation to the register mark; and controlling the laser machining system while taking into account the deviation parameter. For the spatially resolving detection, an image of the region may be created and evaluated, for example.

One or more further laser markings may therefore be additionally lasered into existing register marks during the production step of the laser machining to structure the conductor foil. With the aid of a camera or some other spatially resolving detection system, that region that contains the register mark and the laser marking can be detected to be able to establish the relative positioning between the register mark and the laser marking, for example, by image processing. On the basis of these data, possible deviations can be calculated and made available for the further processing in the form of at least one deviation parameter. In dependence on the deviation parameter, the laser system can then be controlled, for example, by correction values for the laser machining being calculated and the components of the laser machining system being activated in a way corresponding to the correction of possible positioning errors.

After completion of the structuring operation, the pieces of foil are removed from the laterally extended second regions by a cleaning device by a cleaning operation. In this case, the partial bonding force, which is locally restricted and distributed over many locations, between the pieces of foil and the substrate in the region of the bonding zones must be released. The cleaning may take place, for example, by compressed air or suction. Alternatively or in addition, a roller covered with bristles or some other cleaning brush may be used for the cleaning.

Particularly reliable and clean cleaning is achieved in some examples by the pieces of foil being removed from laterally extended second regions by the pieces of foil being transferred to an outer surface of a moving transporting element and detached from the bonding zones by the transporting element and transported away for further processing. During the transfer to the transporting element, attractive forces capable of overcoming the forces exerted by the bonding zones act on the pieces of foil. The transporting element may have a dual function, in that on the one hand the attractive forces necessary for the detachment act between the transporting element and the pieces of foil and in that on the other hand the pieces of foil can be transported away in a controlled manner with the aid of the transporting element. In this way it is possible when cleaning off to avoid a situation in which loose pieces of foil fly around in an uncontrolled manner and could disturb the operation of the installation.

The transporting element may be, for example, a transporting roller, the cylindrical outer surface of which is in rolling contact with the moving laminate during operation. The transporting element may, for example, also be a continuously running-around conveyor belt. The direction of movement of the outer surface of the transporting element may be parallel to the direction of movement of the laminate to be cleaned off or extend obliquely thereto. A cleaning device may have a single transporting element, but if appropriate also two, three or more transporting elements operating independently or in a coordinated manner.

A particularly harmless, controlled detachment with a definable pulling-off force is obtained in some variants of the method by the pieces of foil being sucked onto the outer surface by creating a negative pressure between the pieces of foil and the outer surface of the transporting element in a suction-attaching portion and after that being initially held on this outer surface during further transport.

The pieces of foil sucked onto the outer surface are then preferably transported by the transporting element into the region of a releasing portion and are actively released from the transporting element in the releasing portion by creating a positive pressure between the outer surface and the pieces of foil. The pieces of foil released at a suitable location can then, for example, fall in a collecting container or be transported further by a stream of air, which may be generated, for example, by a sucking-off or blowing-away action. The cleaning by negative pressure can be controlled particularly well with regard to the forces effective for the detachment of the pieces of foil and in a way that is harmless for the products being cleaned.

This cleaning principle is technically implemented in some examples by use of a cleaning device having a transporting element that can be moved by its drive and has an outer surface intended to interact with the pieces of foil and also a device to create a negative pressure between the outer surface and the pieces of foil. The transporting element may have for this purpose gas passages passing through from the outer surface to an inner surface. These passages may be formed, for example, by perforations being introduced during production into a base material that is in itself impermeable to gas. It is also possible to use open-pored material for the production of the transporting element so that a sufficient gas permeability is obtained.

In some examples, the cleaning device has a cleaning roller with a sleeve-shaped outer roller which encloses a possibly fixed roller core and can be turned with respect to the latter by a drive. The outer roller may consist of an open-pored material, for example, of a microporous sintered ceramic or a metal foam. The outer roller may also have a metallic or ceramic sleeve of a gas-impermeable material in which radial gas passages have been introduced in accordance with a predetermined pattern.

In the interior of the outer sleeve, in particular in the roller core, there may be a pressure chamber system having chambers connected or can be connected by way of suitable connections to a pump to create negative pressure or positive pressure in a pressure chamber. The pressure chambers are open toward the outer roller and sealed off with respect to it at the peripheries so that in a suction-attaching portion the outer roller can exert a sucking effect on the pieces of foil and in a releasing portion the positive pressure in the assigned pressure chamber leads to a repelling effect between the outer roller and the attached pieces of foil.

If the pressure chambers of such a roller are supplied exclusively with positive pressure, the roller is also suitable for contactless transport or deflection of the material at the roller. By controlling the positive pressure in the individual pressure chambers, it is possible to compensate for the forces acting due to the weight of the belt or the deflection of the belt and also dynamic forces. In this case, the positive pressure can be controlled region-specifically over the circumference of the roller.

As an alternative to a rotationally symmetrical roller, or in addition thereto, a conveyor belt running around continuously between deflecting rollers may also serve as a transporting element.

In some examples, a transporting element electrostatically charged by a charging device is used so that at least part of the forces of attraction acting from the transporting element on the pieces of foil is obtained from electrostatic forces of attraction. The electrostatic charging may be used, for example, as an alternative to the creation of negative pressure or in addition thereto. If, for example, the material that is porous and/or interspersed with passages has a sufficient proportion of conductive material or is provided with a suitable coating, such a transporting element may be additionally electrostatically charged to exert an electrostatic force of attraction on the pieces of foil to be removed in addition to the sucking force. If appropriate, these pieces of foil can as a result be raised more easily to allow them in the end to be sucked up more easily.

Consequently, purely electrostatic cleaning or at least supplementary electrostatic cleaning is possible. For this, the pieces of foil to be removed may be electrostatically drawn onto a transporting element in the form of a charged belt of polymer, metal or some other suitable material, for example, at short range, typically about 0.5 mm to 5 mm, with preference acting together with gravitational force, and be transported away. The belt serving as a transporting element may run both in the same direction as the substrate web and also transversely thereto. The electrostatic charging may take place, for example, in a polymer belt by brushes or other known technical methods. Electrostatic charging of an electrically conductive cleaning belt, for example, made of metal may take place, for example, by supplying a voltage and insulating the metal strip from ground.

It is also possible to remove pieces of foil from laterally extended second regions to introduce vibrational energy into the laminate. For example, ultrasonic cleaning is possible. In this case, the pieces of foil to be removed are at least partially or supplementarily detached from the bonding zones with the aid of ultrasonic vibrations and/or other suitable vibrations. The ultrasonic vibrations may be introduced into the substrate or the foil web to be removed, for example, by a mechanical connection or be transferred contactlessly over short distances by ultrasonic vibration in the form of ultrasound waves through air or some other gas. Detachment of the pieces of foil from the bonding zones is then realized, or at least supplemented, by the vibrational energy, if appropriate in resonance. Preferably, ultrasonic cleaning is used in a supplementary manner in combination with some other cleaning method. If appropriate, a more stable and quicker cleaning process can be obtained as a result.

It is also possible to provide the moving transporting element on its outer surface with a fluidic bonding film, which increases the forces of adhesion between the outer side of the transporting element and the pieces of foil to be detached and transported away. The bonding film may, for example, be a liquid film which, for example, consists of water or of a water-containing liquid. It may also be a polymeric liquid such as, for example, a liquid adhesive substance.

The measures for the cleaning of the structured laminates, i.e., to remove the pieces of foil of the conductor foil, may be used independently of the other method steps, even in other methods of the generic type and other installations to produce structured laminates. For example, these measures or a corresponding cleaning device may be used in known installations and methods such as are described, for example, in EP 0 790 123 B1 or WO 2009/118455 A1. The same also applies correspondingly to the production of register marks by using adhering portions applied to the substrate (or the conductor foil) simultaneously with the application of adhesive, and to the procedure described herein for the self-calibration of a laser machining system in which one or more laser markings are created in the region of register marks and their deviations are used for controlling the laser machining system (positional deviations).

We also provide an installation configured to carry out the method and to a multilayer element produced or can be produced with the aid of the method.

These and other features emerge not only from the appended claims but also from the description and the drawings, where the individual features can be realized by themselves or as a plurality in the form of subcombinations in an example and in other fields and can constitute advantageous and inherently protectable examples. Examples are represented in the drawings and are explained in more detail below.

In FIG. 1, an example of an installation 100 that produces laminated multilayer elements on flexible substrates in strip form in a roller-to-roller process is shown. The installation shown is configured for the production of antennas for radio-frequency identification systems (RFID antennas), but may also be used for the production of other multilayer elements that can be produced by lamination and have conductive structures, for example, for electrical circuits. For example, with a corresponding configuration, multisided printed circuit boards, capacitors, electrodes of printed batteries, sensors, for example, strain gages or actuators can also be produced.

In the example, the installation of a modular construction processes in a linear production line a flexible substrate 200 in the form of a long flat strip and may be formed, for example, by a film of plastic or a paper web. In specific applications, other non-conductors or foils made of metal or with metal layers can also be used as the substrate. The fresh, still unmachined substrate material is drawn off from a storage roller 122 located in an unwinding device 120 on the input side of the installation. From there, the substrate is transported continuously through various devices or modules of the installation in transporting direction 202 up to a winding-up roller 182 located in a winding-up device 180 at the end of the installation 100. During the transport of a portion of the substrate through the installation, the portion runs successively through different working stations of the installation of a modular construction which are respectively configured to carry out one or more working steps of the production method.

An adhesive applying device 130 is configured to apply a thin layer of adhesive on the upper side 210 of the substrate running through, over a prescribed working width, which is generally less than the strip width of the substrate. In a downstream laminating device 140, a conductor foil 142, for example, an aluminum foil or some other metal foil, is applied under pressure to the layer of adhesive so that the conductor foil connects to the substrate by the layer of adhesive lying in between, whereby a laminate is produced. In a downstream laser machining device 150, the laminated-on metal foil is laterally structured, by the conductor foil being severed by a laser beam at the boundaries of those regions intended to form the desired conductor structure of the finished RFID antenna. Depending on the layout of the conductor structure, this involves producing pieces of foil of a greater or smaller size of the metal foil that do not belong to the desired end product and, therefore, have to be removed.

Provided for cleaning, i.e., for removing the pieces of foil, is a downstream cleaning device 160, which in the example has a cleaning roller 162 working by negative pressure and positive pressure (cf. examples in FIGS. 13 to 20). The cleaning roller has a gas-permeable outer roller and a roller core with a negative-pressure chamber 166 and a positive-pressure chamber 167 to suck up pieces of foil by negative pressure in a suction-attaching portion 172, transport them into a releasing portion 174 and release them there by positive pressure. The released pieces of foil are transported away by a stream of air generated by a suction-removing device 168.

FIG. 1 shows only a few devices of the installation as a whole. With the configuration shown and other configurations, the installation may have further devices or modules. For example, a pre-cleaning device that cleans the substrate directly before the application of adhesive may also be provided between the unwinding device 120 and the adhesive applying device 130. One or more adhesive post-treatment devices may also be provided between the adhesive applying device and the laminating device. For example, a drying device may be provided before the lamination to dry an adhesive that is still too moist after the application of adhesive. When using adhesives only activated by a post-treatment, a corresponding activation unit may be provided. When using an adhesive activated by ultraviolet radiation, for example, a UV radiation unit may be provided. If the adhesive is initially applied over the full surface area, a post-treatment device may be arranged between the adhesive applying device and the laminating device and may, for example, have a flexographic printing unit or a jet printing unit to apply a laterally structured covering layer to create intermediate regions between bonding zones. After cleaning off the finished-structured substrate web, the finished multilayer elements may be singulated by a cutting device which may be arranged between the cleaning device 160 and the winding-up device 180.

The adhesive applying device 130 is configured such that a laterally structured layer of adhesive with coated regions and uncoated regions can be applied to the upper side 210 of the substrate. For this purpose, the adhesive applying device has a printing unit designed for flexographic printing in which adhesive liquid is transferred from an adhesive store 132 by way of a roller unit to a printing form cylinder 134 which carries a flexible printing plate with raised structures that transfer the adhesive to the upper side of the substrate.

In the figure of a detail represented under that, a plan view of a detail of the substrate 200 running through is shown. In the example, the laterally structured layer of adhesive 220 forms for each RFID antenna to be produced later an outer rectangular ring, the width of which is dimensioned such that the conductor tracks of the conductor structure to be applied can lie on this ring over the full surface area (cf. for example, FIG. 2). In the interior of the ring there is a substantially rectangular laterally extended second region 250, which in the finished product is not intended to have any conductor material. In this laterally extended second region, adhesive is applied in point form to form a grid-like pattern of relatively small bonding zones 224. Laterally extended second regions outside the rectangular ring of adhesive may also have adhesive locations distributed in a point-formed manner. In particular, the region between the rings may be partially (at least in the vicinity of the rings) or completely covered with small bonding zones.

In the same printing operation, an adhesive portion of a register mark 230 is applied at the periphery of the substrate web alongside that region to which the metal foil is later laminated, and the position of the adhesive portion is defined exactly in relation to the regions of the application of adhesive for the RFID antennas since the application of adhesive takes place in the same printing process. In a device not represented, between the adhesive applying device and the laminating device, a color powder is sprinkled onto this adhesive register mark or applied in some other way on the one hand to bind the adhesive and on the other hand to make the register mark visible for later camera detection.

In FIGS. 2 to 5, various examples of the spatial distribution of adhesive material in a laterally structured layer of adhesive are represented together with the conductor structure 145 applied later and created by laser structuring. Those regions in which the conductor structure remains on the finished product are referred to here as first regions 240. Those regions lying adjacent to the first regions and intended to be electrically non-conductive in the finished product are referred to as second regions 250. The second regions may be divided once again into relatively narrow second regions, which lie in particular between the conductor tracks of the conductor structure 145, and laterally extended second regions, the extent of which is typically many times greater than the width of the conductor tracks or the width of the narrow regions lying between the conductor tracks. For example, a substantially rectangular second region is obtained in the interior of the conductor structure closed in the form of a ring. Furthermore, the outer periphery of the conductor structure is adjoined by second regions which may extend up to the adjacent conductor structures.

In such structures, the application of adhesive takes place such that underneath the conductor structure, i.e., in the first regions, the adhesive is applied over the full surface area (uninterruptedly) while in laterally extended second regions 250 adhesive is only partially applied to produce point-formed bonding zones 224 which are, for example, distributed over the surface of the substrate substantially in a manner following a rectangular grid. Typically, the area fraction of the bonding zones with respect to the total area of the second regions lies in the range of a few percent, for example, 2% to 50%, in particular 5% to 30%.

One production method may, for example, involve the use of a pressure sensitive adhesive (PSA), which after the application of adhesive is also activated by pressure while irradiating with UV radiation. The use of thermally activatable adhesives is also possible. The thickness of the layer of adhesive may, for example, be 20 µm to 100 µm, in particular 50 µm to 80 µm. The thickness of the conductor foil is typically smaller than the thickness of the layer of adhesive and may, for example, be 5 µm to 50 µm, in particular 10 µm to 20 µm. In the example of an RFID antenna, the width of the conductor material webs may, for example, be 0.1 mm to 2 mm, in particular 0.5 mm to 1 mm. The lateral distance between adjacent bonding zones may be of the same order of magnitude, but is often greater than the width of the conductor material web.

Figure 3:
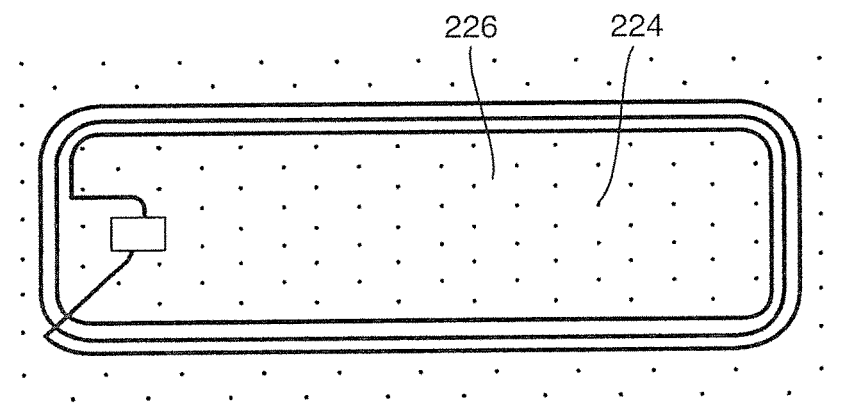
FIG. 3 shows a representation similar to FIG. 2, with a uniform pattern of adhesive with point-formed bonding zones.
Figure 4:
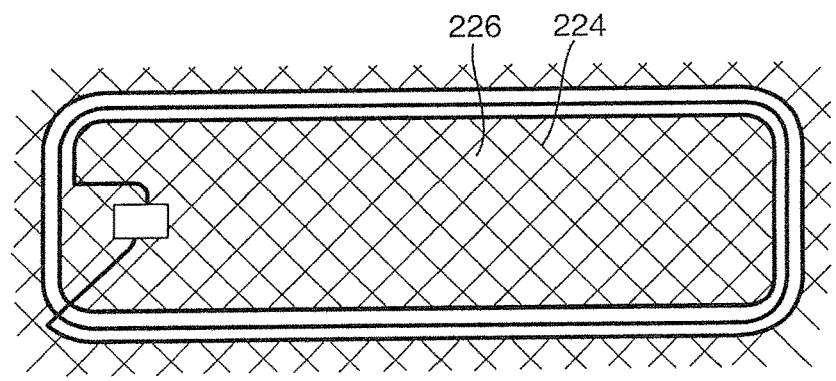
FIG. 4 shows a corresponding representation with a laterally structured layer of adhesive, which has a rectangular pattern with linear bonding zones crossing over one another.
Figure 5:
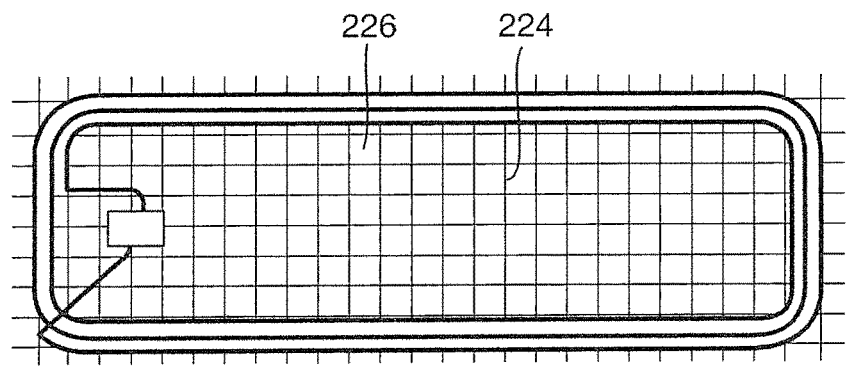
FIG. 5 shows another variant of a rectangular pattern of adhesive with linear bonding zones in a different orientation.

In the example of FIG. 3, there is within the laterally extended second regions a uniform distribution of point-formed bonding zones in a hexagonal symmetry. The examples of FIGS. 4 and 5 show that bonding zones 224 may also be designed as lines that lie at a distance from one another and in the examples respectively cross one another, but in others may also lie next to one another without crossing. Here, too, there are lateral distances from the adjacent bonding zones respectively perpendicularly to the paths followed by the lines of the bonding zones so that there form quadrangular rectangular intermediate regions 226 without any bonding force that are relatively large in comparison with the bonding zones.

Figure 6:
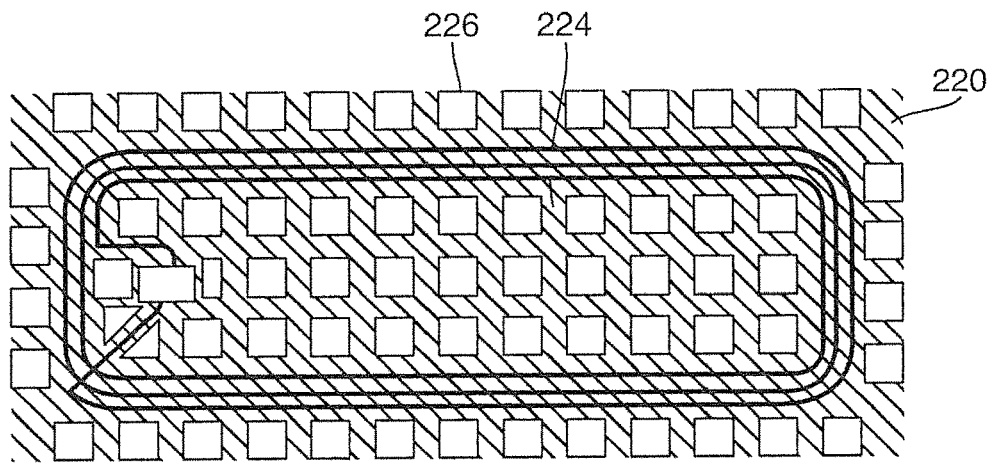
FIG. 6 shows an example with a layer of adhesive applied over the full surface area, onto which a pattern of quadrangular regions of lacquer, paint or ink has been applied to create non-bonding intermediate regions between bonding zones.
Figure 7:
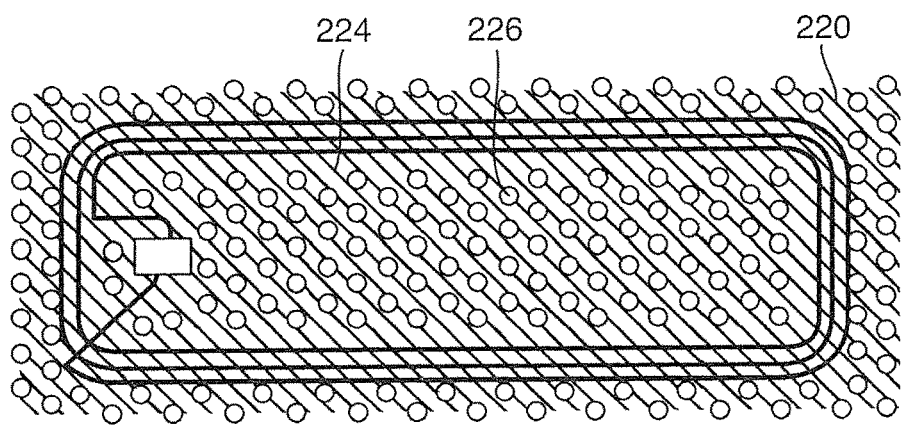
FIG. 7 shows another variant with full-area application of adhesive and subsequent point-formed application of a pattern of lacquer, paint or ink to reduce the adhesive force locally in intermediate regions.
Figure 8:
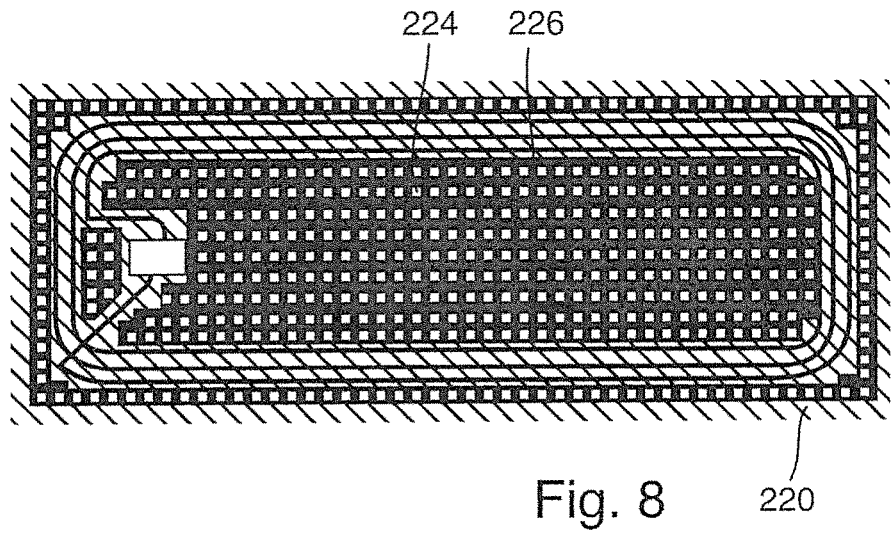
FIG. 8 shows another variant with a layer of adhesive applied over the full surface area, onto which a laterally structured layer of lacquer, paint or ink has been subsequently applied in a strip-formed crossing pattern to reduce the adhesive force locally in intermediate regions.
Figure 9A:
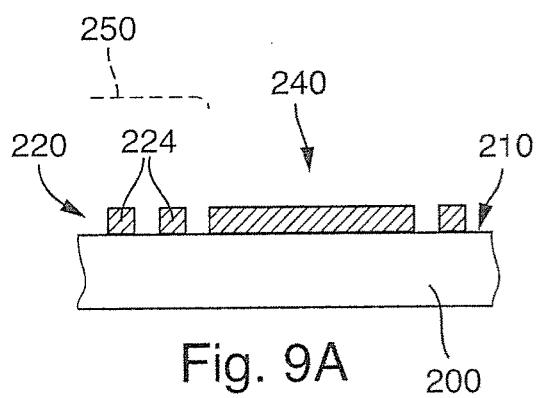
FIG. 9 schematically shows various production steps in an example with structured application of adhesive.
Figure 9B:
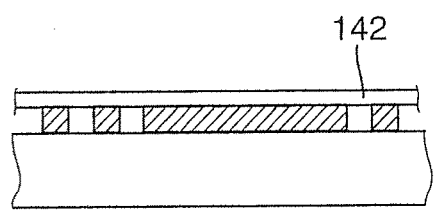
Figure 9C:
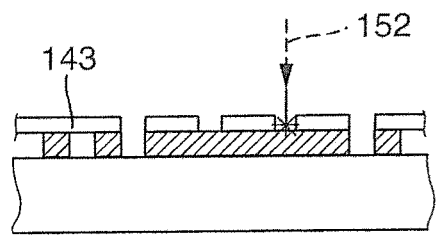
Figure 9D:
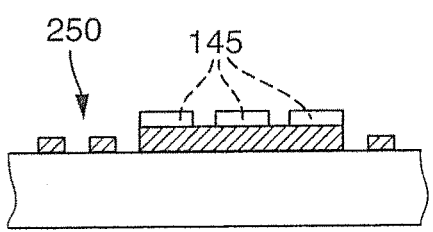

An alternative procedure to create a layer of adhesive that have bonding zones distributed in accordance with a specific pattern in laterally extended second regions and intermediate regions without any bonding force, or with only reduced bonding force, lying in between is explained in more detail on the basis of FIGS. 6 to 8. In this variant of the method, first, a layer of adhesive of uniform layer thickness is applied to the substrate over the full surface area, i.e., in the first and second regions. This may be carried out, for example, by a smooth printing roller or by spraying on, slot-die casting or the like. To obtain thereafter within the laterally extended regions a distribution of bonding zones with a relatively small area fraction and intermediate regions substantially without any bonding force lying in between, after that those intermediate regions intended to have reduced bonding force or no bonding force are post-machined. Post-machining may be achieved in particular by one or more of the following measures: structuring with electromagnetic radiation, for example, laser radiation; mechanical structuring; for example, by punching, grinding away or the like; covering by a covering layer, for example, by UV lacquer, ink or paint; activating regions of adhesive by electromagnetic irradiation such as, for example, by UV light or chemically by adding/introducing a substance. Inactivation of regions of adhesive by electromagnetic radiation such as, for example, UV radiation or laser radiation to cure the adhesive material. Inactivation may also take place chemically by adding/applying a suitable substance between the substrate and the conductor foil.

In the examples of FIGS. 6 to 8, to create the non-bonding intermediate regions 226, a thin covering layer 228 (cf. FIG. 10) of a printable substance has been applied in accordance with a corresponding pattern such that the substance locally covers the layer of adhesive and, as a result, reduces the adhesive force locally in the intermediate regions. A lacquer, a paint or an ink may be used, for example, for this purpose. By analogy with the application of adhesive described above, the substance may, for example, be applied by the flexographic printing process or by an inkjet process.

Figure 2:
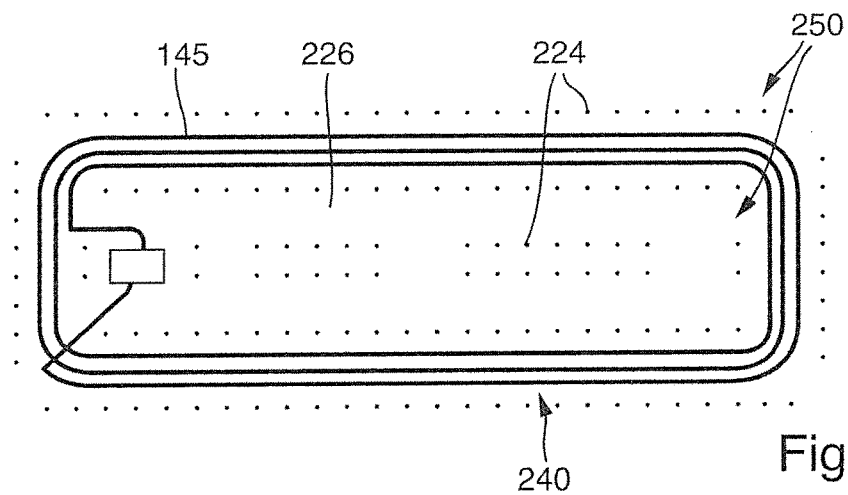
FIG. 2 shows a schematic plan view of a detail of a substrate in strip form with a conductor structure adhesively attached thereon and comprising conductor tracks of an RFID antenna, point-formed bonding zones of a laterally structured layer of adhesive being arranged in laterally extended second regions within and alongside the conductor structure.

With regard to the spatial distribution of adhering bonding zones and non-adhering or only weakly adhering intermediate regions over the surface of the substrate, the following should also be noted. In the examples of FIGS. 2, 3 and 8, respectively, point-formed bonding zones 224 are obtained, surrounded in all directions by adhesive-free, non-adhering intermediate regions 226. Here, there is a distance between adjacent bonding zones in all directions within the coated surface area. The bonding zones may be designed as round or oval or else, if appropriate, polygonal (FIG. 8) in cross section. In FIGS. 4, 5, 6 and 7, bonding zones more or less contiguous in the manner of a line grid are obtained, with intermediate regions surrounded on all sides by bonding zones lying in between. There is a distance between adjacent bonding zones in certain directions (transversely in relation to the lines) within the coated surface area. In each case, the chosen procedure in the structuring allows the spatial distribution of the bonding zones, their form and size and also the area fraction of the bonding zones with respect to the total area of the laterally extended second regions to be specifically prescribed to set in the laterally extended second regions a desired overall level of bonding force that on the one hand initially keeps the cut-free pieces of foil reliably in the second regions and later during detachment allows them to be safely detached.

Figure 16:
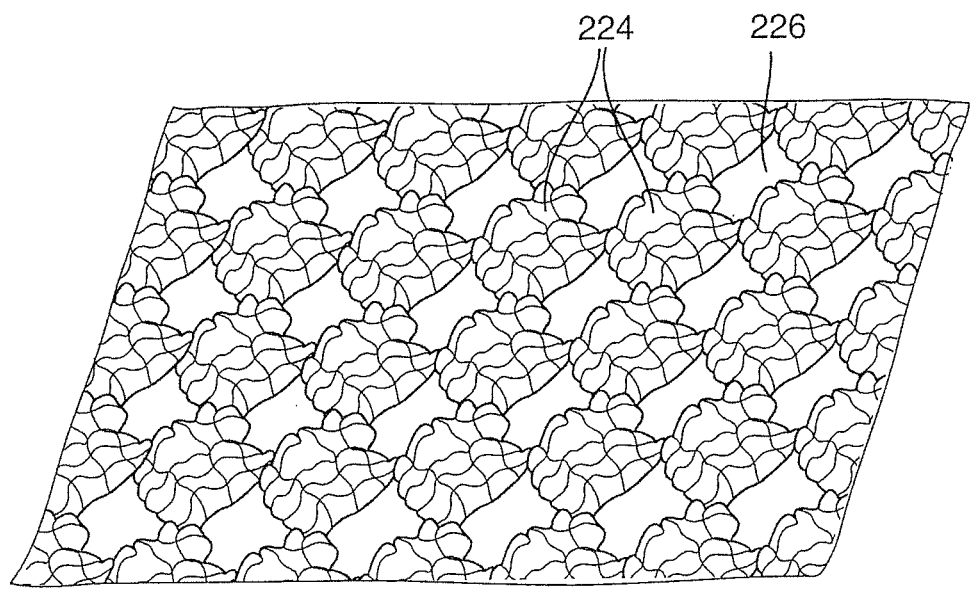
FIG. 16 shows a 3D representation of the surface profile of a layer of adhesive, which lies in a laterally extended second region and has been structured by laser radiation for creating point-formed bonding zones.

A further possibility to produce a laterally structured layer of adhesive is shown on the basis of FIG. 16. The figure shows an obliquely perspective 3D representation of the surface profile of a layer of adhesive, which lies in a laterally extended second region and has been structured by laser radiation to create point-formed bonding zones. For this purpose, in an original layer of adhesive of uniform layer thickness, laser light was radiated in, in a rectangular grid such that there remain upwardly protruding bonding zones 224 (light regions), in the region of which the layer thickness substantially corresponds to the original layer thickness. In the dark-appearing intermediate regions 226, the adhesive material has been partially removed by exposure to the laser radiation and/or converted such that virtually no adhesive force remains there any longer.

Once an electrically conductive layer (conductor layer) in the form of a metal foil has been fastened to the substrate by the directly or subsequently laterally structured layer of adhesive in a laminating operation, the conductor foil is structured to achieve the desired target contour, to be specific the conductor structure that is aimed for. Preferably suitable to machine the contour is electromagnetic radiation such as laser radiation, which can be used by a scanner or in a mask projection process and, if appropriate, with beam splitting for parallel processing. Provided in the installation by way of example is a laser machining device 150 configured as a laser scanner and generates a focused laser beam 152 which serves as a separating tool and is guided by a scanning device along the boundaries of the conductor structure to be created. Typical cut widths in a focused laser beam may, for example, be 1 µm to 250 µm, in particular 30 µm to 120 µm.

The laser machining system of the installation 100 comprises (at least) a camera 154 connected to the control device 156 of the laser system and with its image field can detect the peripheral region of the substrate web running through in which the register mark 230 is located (see detail under the laser machining device). The laser machining system is programmed such that a self-calibration is automatically carried out at certain time intervals or continuously, whereby highest positioning accuracy can be achieved in the laser machining on the moving substrate. For this, a laser marking 155 is created at a prescribed point in time in the region of the register mark 230 provided at the periphery of the substrate, by the laser beam being directed for a short time at the register mark. The camera 154 detects the region of the register mark and passes the image data to the control device 156 which comprises an image processing system to determine from the image data a possibly existing deviation of the position of the laser marking 155 from the expected setpoint position at the center of the register mark 230. This is used to derive one or more deviation parameters which can be processed by the control 156 to calculate correction values for the laser machining and alter components of the laser machining system (for example, lenses, mirrors or the like) such that the deviation is minimized. In this way, for example, drift effects can be avoided and it is also possible with a moving substrate to guide the laser beam exactly along the desired cutting line.

In this method step, existing register marks and the laser markings to be created in the region thereof may respectively have a circular or round or otherwise closed form and lie one within the other so that, in the event of possible decentering, the deviation parameter can be derived. However, other forms are also possible. The register marks and the laser markings also need not lie one within the other, but may be next to one another. It is favorable if both the register marking and the laser marking introduced in the region thereof can be detected at the same time by the same detection system, for example, a camera.

FIGS. 9A to 9D show various phases of the production of a structured laminate in that variant of the method in which a structured application of adhesive takes place directly. First, the laterally structured layer of adhesive 220 is applied to the surface 210 of the substrate 200, it being applied over the full surface area in the first regions 240 and small bonding zones 224 with a lateral distance from one another being created in laterally extended second regions 250. In the laminating operation (FIG. 9B), the metal foil 142 is fixed on the adhering surface of the structured layer of adhesive. In the structuring operation in the laser machining device, the material foil is completely severed along the boundaries of the desired conductor structure. Within the laterally extended regions, relatively large contiguous pieces of foil 143 remain attached to the spatially distributed bonding zones so that the structuring step is not disturbed by relatively large pieces of foil possibly becoming detached. In the narrow intermediate regions between the desired conductor tracks, the material foil is likewise removed by laser ablation in the examples the layer of adhesive thereunder being retained over the full surface area. In the subsequent cleaning off in the cleaning device, the contiguous relatively large pieces of foil 143 are removed. On the finished end product (FIG. 9D), the desired conductor structure firmly connects to the substrate by the full-area bonding contact in the first regions. In the laterally extended, electrically non-conductive second regions 250, there generally remains a structured pattern of adhesive material, which mechanically stabilizes the substrate in these exposed regions.

FIG. 10 schematically shows production steps for variants of the method with application of adhesive over the full surface area and subsequent local covering of intermediate regions between bonding zones. After the full-area application of adhesive of a uniformly thick layer of adhesive 220, a structured layer of lacquer 228 is applied in accordance with a prescribed pattern, the first regions, which on the finished product carry the layer of conductor material, not being covered. The thickness of the covering layer is shown greatly exaggerated for purposes of illustration. It is generally only a fraction of the thickness of the layer of adhesive. After that, the metal foil is fixed on the partially covered layer of adhesive (FIG. 10B), thereby producing a laminate in which in the first regions 240 there is strong bonding contact between the adhesive and the foil, while in the laterally extended second regions 250 there is only point-formed or linear bonding contact in the bonding zones between the intermediate regions. After that, the conductive layer (metal foil) is structured by a laser (or in some other way) (FIG. 10C), relatively large pieces of foil 143 initially remaining attached to the substrate in laterally extended second regions. The regions of the conductive layer to be removed, i.e., the pieces of foil, are then removed later in the cleaning operation (FIG. 10D).

In FIG. 11, some variants of the laser structuring of the different variants of applying an adhesive substance are represented. In the variant in FIG. 11A, the adhesive protrudes slightly beyond the conductive layer of the first region, at least at one edge. In the case of FIG. 11B, the adhesive is flush with the conductor structure in the first region, at least at one edge. In the variant in FIG. 11C, after the structuring the layer of adhesive does not quite reach up to the edge of the conductive structure, at least at one edge. FIG. 11D shows that adhesive substance can also reach into the region of a piece of foil to be removed, at least in the region of one edge of the conductor structure.

On the basis of FIG. 12, it is shown by way of example that, in the structuring of the layer of conductor material, the adhesive substance and the substrate, different structuring depths can be created, according to requirements. In FIG. 12A, only the conductive layer is structured to a certain depth, without being severed completely. The layer of adhesive lying thereunder is not reached in this case. According to FIG. 12B, the conductor foil or the conductive layer is structured up to the surface of the adhesive and thereby severed completely, the adhesive remaining substantially unmachined. In the variant of FIG. 12C, structuring is performed into the adhesive and at certain points even into the surface of the substrate.

It should be mentioned that cuts from both sides, from the upper side of the substrate and the underside of the substrate, are also possible, for example, to make plated-through holes from one side to the other possible, if this is necessary when there are a number of electronically functional layers on one or both sides of the substrate.

As an alternative to structuring by electromagnetic radiation, it is also possible, depending on the materials and structural forms, to use mechanical processes such as, for example, punching or water jet machining, or chemical processes such as etching, if appropriate with protective covering for regions that are not to be removed, or else a lift-off process, where the variants can, if appropriate, also be used in combinations.

Figure 13A:
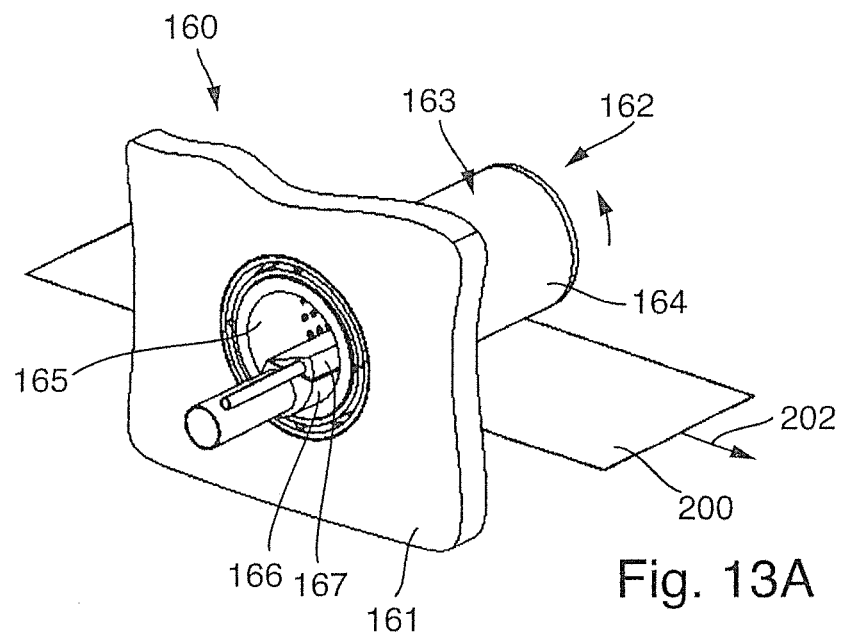
FIG. 13 shows a detail of an example of a cleaning device that removes pieces of foil of a structured laminate with a suction/pressure cleaning roller in two different views.
Figure 13B:
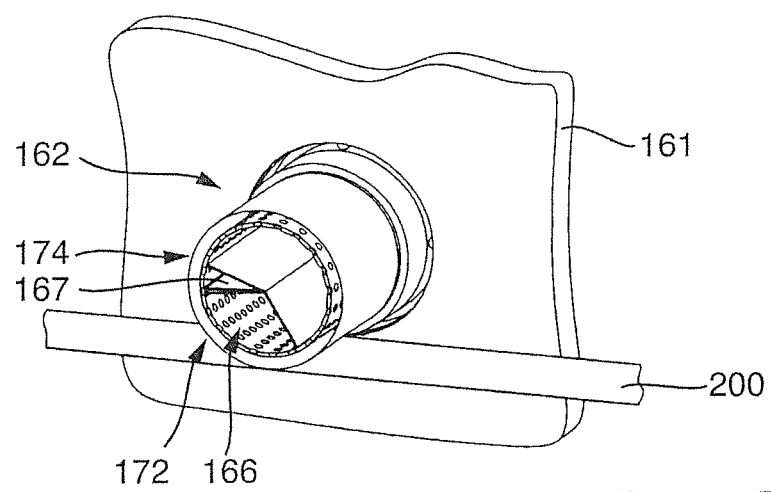
Figure 14A:
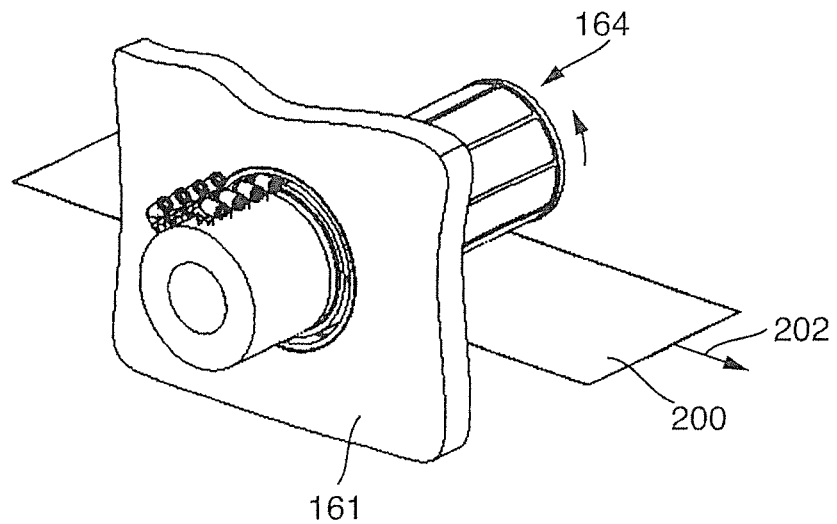
FIG. 14 shows a detail of another example of a cleaning device that removes pieces of foil of a structured laminate with a suction/pressure cleaning roller in two different views.
Figure 14B:
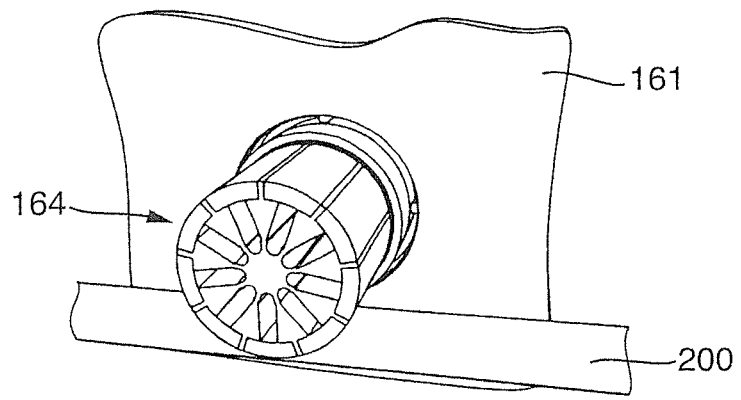
Figure 15:
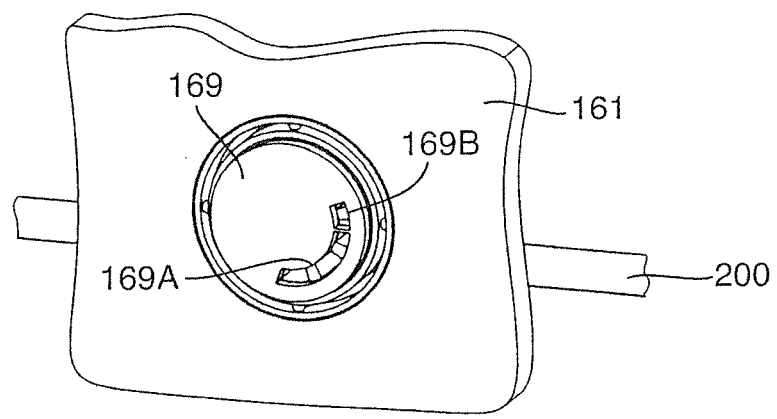
FIG. 15 shows another variant of a cleaning roller which can detach pieces of foil from the laminate in a suction-attaching portion, transport them into a releasing portion and release them again there by positive pressure.

Various examples of cleaning devices to remove the pieces of foil after the structuring operation are explained on the basis of FIGS. 13 to 15. FIG. 13 shows in 13A a side view and in FIG. 13B an inside view of a detail of a cleaning device 160 in which a cleaning roller 162 with a horizontal axis of rotation is mounted in a vertical side wall 161 such that there is a narrow, virtually linear slip-free rolling contact between the outer surface 163 of the cleaning roller and the upper side of the substrate web 200 running through in the transporting direction 202. If appropriate, there may also be a small vertical distance, typically of the order of magnitude of 0.1 mm or less. The axis of rotation of the roller extends perpendicularly in relation to the transporting direction 202.

The cleaning roller 162 has an outer roller 164 which is permeable to gas in the radial direction, can be turned by a drive (not shown) about its horizontal axis of rotation with adjustable speed and acts as a movable transporting element of the cleaning device. The outer roller encloses a fixed roller core 165. The roller core comprises a negative-pressure chamber 166 connected to the suction side of a pump, and a positive-pressure chamber 167 arranged downstream of the negative-pressure chamber in the direction of rotation of the cleaning roller and connects to the pressure side of a pump. The inside view in FIG. 14B shows that, in the interior of the roller core, the negative-pressure chamber 166 facing the substrate web, and the positive-pressure chamber 167 directed obliquely upward, are bounded in the circumferential direction by relatively simple metal sheets in plate form extending transversely in the interior of the roller core.

The pressure chambers are open toward the outer roller 164 and sealed off with respect to it at the peripheries of the housing parts of the pressure chambers. As also shown in FIG. 1, the radial gas permeability of the outer roller in the region of the positive-pressure chamber 166 has the effect of providing a suction-attaching portion 172, which extends over about 90° to 120° of the roller circumference and comprises the region where the cleaning roller and the substrate web come closest to one another. The cleaning roller can exert an attractive effect by negative pressure on the pieces of foil 143 still attached to the substrate web. In the region of the positive-pressure chamber 167 following in the direction of rotation, on the other hand, a repelling effect between the outer roller and the attached pieces of foil is obtained due to the positive pressure in a relatively narrow releasing portion 174.

As a result, the outer roller 164 performs a dual function. As schematically represented in FIG. 1, the suction-attaching portion ensures that the pieces of foil still attached to the substrate web in the region of the bonding zones are detached from the substrate web, transferred to the outer roller and attach themselves to the outside of the cleaning roller. The turning of the cleaning roller has the effect that, while they are attached to the suction-attaching portion, they are transported into the region of the releasing portion which is under positive pressure. There, the pieces of foil are actively repelled from the outer surface 163 of the sleeve-shaped transporting element (outer roller) by positive pressure and pass into the effective region of the suction-removing direction 168, which transports the pieces of foil upwardly away in a controlled manner.

This cleaning principle may be technically implemented in various ways. In the example of FIG. 13, the cylindrical outer roller consists of an open-pored roller material, for example, an open-pored sintered material of metal, ceramic or a composite material. A foamed plastic similar to a sponge may also be used to achieve gentle touching of the foil material. If appropriate, the elastically yielding porous material may be designed as a covering for a porous or in some other way gas-permeable roller body and, if appropriate, be exchangeable as a wearing part. The material is preferably made to cover the full surface area so that an uninterrupted outer surface is obtained. In the interior of the outer sleeve there is a stable sleeve-shaped gas-permeable screen, of which principally some radial perforations can be seen in FIG. 13B. The outer sleeve and the screen turn together.

In the example of FIG. 14, the sleeve-shaped outer roller 164 is divided into a number of segments of the same circumferential width, following one another in the circumferential direction. Each segment consists of porous material; narrow interruptions between the segments correspond to the inner chamber arrangements. In the interior of the outer sleeve, i.e., in the roller core, there are separate pressure channels or pressure chambers for the individual segments which turn along with the roller. The outer pressure connections do not turn with it. Between the pressure connections, sealed-off rotary leadthroughs are arranged in the region of the pressure lines up to the interior of the pressure chambers.

The tightness at the end face can be ensured in the structural design, for example, by mechanical seals or radial seals. Inside the roller, sufficient gas tightness can be achieved, for example, by small tolerances, for example, of 0.5 mm or less, between the pressure chamber and the rotating inner wall of the roller. The interruptions between the segments are sufficiently pressure-tight that no gas exchange can take place between pressure chambers that are adjacent in the circumferential direction.

The suction removal from the interior of the pressure chambers and the blowing in of compressed air take place positionally correctly in relation to the desired position of the suction-attaching portion and the releasing portion. In the example of FIG. 15, the pressure distribution takes place on the rotary slide-valve principle by a segment disk 169 attached to the end face of the pressure chambers and has two passages that lead to the pressure chambers and extend in a curved manner in the circumferential direction. The wider passage 169A, on the side facing the substrate web 200 supplies three or four adjacent pressure chambers and connects to the suction side of a pump and ensures that there is a negative pressure in the pressure chambers respectively coming into the region of this slot to suck up the pieces of foil. The smaller slot 169B adjacent in the direction of rotation supplies only one or two pressure chambers and connects to the pressure side of a pump so that a releasing portion is respectively produced in this region whenever a pressure chamber turned in this region is subjected to compressed air through the slot.

In the examples described in detail, all of the method steps of the production process are carried out in one pass in a single installation of a modular construction. In the case of other variants of the method, the lamination, including application of adhesive, possible post-machining and adhesive attachment of the conductor foil, takes place in a separate installation and the laminate resulting as an intermediate product is initially rolled up and later further processed from the roll in another installation, which can then carry out the structuring and subsequent process steps.

Instead of a roller-to-roller process, a sheet-processing process (sheet-to-sheet process) may also be used.

In the production of multilayer elements, a lift-off process may be carried out if appropriate. The term "lift-off process" refers here to a digital, laser-based production process with a transfer approach comprising the following process sequence. A metal foil and a transfer substrate (for example, a further foil) are used as the starting material. The metal foil or the substrate is coated with a thin liquid film. Subsequently, the metal foil and the substrate connect in an areal manner in a laminating operation, the bonding being based on forces of adhesion imparted by way of the thin liquid film. This is followed by creating the desired target contour, i.e., the desired conductor structure, by selective structuring of the metal foil by a laser. In the structuring, work is performed with a high energy intensity to achieve an ablation of the metallic foil material. In a subsequent lift-off operation, energy is selectively radiated by a laser into the regions that are later to be cleaned off, with the aim of vaporizing the fluid between the substrate and the metal foil. In this method step, working is performed with a lower energy intensity than in the selective structuring so that the metal foil is not damaged, but the fluid is vaporized. The irradiation may take place from the upper side and/or from the underside of the multilayer element. The coupling in of the energy may take place into the transfer substrate, the fluid or the metal foil or into a number of these constituents of the layer structure. If required, additional cleaning may follow. Finally, a lamination takes place to create the final composite. In this case, the structured foil located on the transfer substrate, i.e., the conductor structure, connects to a further substrate (end substrate) by a layer of adhesive lying in between. The adhesive may be applied to the substrate and/or to the conductor foil over the surface area, but depending on the target product the adhesive may also be only applied selectively. If desired or required, the transfer foil used in the laser structuring may be pulled off again after the laminating operation so that the transfer foil does not remain on the end product. In this way, very exactly dimensioned conductor structures can be produced if appropriate.

In principle, there is the possibility with respect to the method and the installation of creating not just a single conductive structure, i.e., a conductor structure, but if appropriate a number of conductor structures one on top of the other or on the front side and the rear side of the substrate. If appropriate, plated-through holes between various layers may be created through the substrate. Alternatively or in addition, electrically conductive contacts may be realized by way of the outer periphery of a component. If a number of conductor structures that are present in different layers are to be created on a conductive component, this may take place by, following completion of the production of a first conductor structure, the production process after the structuring of the electrically conductive structure or after the cleaning beginning once again after the step of providing the substrate or the carrier substrate.

Layers may also be built up partially or completely from electrically non-conductive insulating material or from semiconductor materials to be able to produce more complex, in particular also multilayered, electrical components or even integrated circuits. Furthermore, multilayer elements produced by the method and/or with the installation can be fitted with further electronic components such as, for example, integrated circuits, computer chips or processors.

Optionally, the production method may be supplemented with steps of quality control during or after various machining steps. Furthermore, identification numbers and other markings may be applied to or incorporated in the products produced by this production method by a printing unit, for example, a jet printing unit (inkjet) or a laser inscriber. It is also possible additionally to apply a protective layer to one side or to both sides of the product, for example, to achieve lamination into a protective sheath.

In one variant of the method, metal particles, nanoscale or microscale metal inks, precursor inks, oxidated inks, preferably metal-oxide particles dissolved in ink or similar substances are applied to the substrate in a desired contour, i.e., with desired local distribution. The application may take place, for example, by the jet printing process (inkjet) or by flexographic printing. The particles, initially applied in a suspended form are subsequently sintered within the desired structure by laser radiation or a flash lamp or in some other way by the input of energy and, as a result, form an electrically conductive composite that bonds strongly to the substrate or is welded to it. If, on the other hand, an electrically non-conductive region is to be specifically produced, for example, to avoid electrical connections between adjacent conductive layers, an ink or the like with non-conductive particles may also be used instead of the metal particles. This variant of the method of creating conductor structures with a possibly complex form consequently comprises a combination of a printing technique (for the application of the particles to be sintered) and a subsequent sintering operation for the formation of a solid body from the precursors.

This variant of the method may also be meaningful as an addition in combination with other alternatives of the method. For example, it is possible to print a precursor ink and subsequently structure it by a laser to generate finer details than would be achievable by sintering without post-machining. The sintering operation may be carried out before or after the laser structuring. Bridges or plated-through holes may also be printed.

The invention claimed is:

1. A method of producing a multilayer element with a substrate and at least one conductor structure connected in an areal manner to the substrate, which has first regions of electrically conductive material, which is present in accordance with a prescribed pattern, while electrically non-conductive second regions lie between the first regions comprising:
    connecting a conductor foil to the substrate such that the conductor foil fully connects to the substrate in the first regions and a partial bonding contact between the substrate and the conductor foil is created at a multiplicity of bonding zones in laterally extended second regions;
    structuring the conductor foil by cutting the conductor foil along boundaries of the first regions so that, after cutting, contiguous pieces of foil are still attached to the substrate in the regions of the bonding zones; and
    removing contiguous pieces of foil of the conductor foil from the laterally extended second regions by releasing the partial bonding contact between the substrate and the conductor foil;
    wherein the conductor foil connects to the substrate by a layer of adhesive lying in between, and
    wherein, before connecting the conductor foil to the substrate, in a first partial operation a layer of adhesive is applied to the substrate or the conductor foil over the full surface area in first and second regions, and after that, in a second partial operation, intermediate regions of the layer of adhesive with reduced bonding force or without any bonding force, are thereby created by a post-treatment within the laterally extended second regions between the bonding zones provided.

2. The method as claimed in claim 1, wherein, in the post-treatment, a covering layer is applied in the intermediate regions between the bonding zones to the layer of adhesive or a corresponding position on the surface of the conductor foil in accordance with a prescribed pattern, the intermediate regions between the bonding zones being covered with a lacquer or an ink.

3. The method as claimed in claim 1, wherein, in a post-treatment, intermediate regions between the bonding zones are treated by laser radiation, adhesive material of the layer of adhesive being at least partially removed locally in the intermediate regions.

4. A method of producing a multilayer element with a substrate and at least one conductor structure connected in an areal manner to the substrate, which has first regions of electrically conductive material, which is present in accordance with a prescribed pattern, while electrically non-conductive second regions lie between the first regions comprising:
    connecting a conductor foil to the substrate such that the conductor foil fully connects to the substrate in the first regions and a partial bonding contact between the substrate and the conductor foil is created at a multiplicity of bonding zones in laterally extended second regions;
    structuring the conductor foil by cutting the conductor foil along boundaries of the first regions so that, after cutting, contiguous pieces of foil are still attached to the substrate in the regions of the bonding zones; and
    removing contiguous pieces of foil of the conductor foil from the laterally extended second regions by releasing the partial bonding contact between the substrate and the conductor foil;
    wherein the conductor foil connects to the substrate by a layer of adhesive lying in between, and
    wherein, before connecting the conductor foil to the substrate, a laterally structured layer of adhesive is applied to the substrate or to the conductor foil, adhesive material being applied over a full surface area in the first regions and partially, in accordance with a prescribed pattern, in laterally extended second regions, to create the bonding zones, by a jet printing process, a flexographic printing process, a screen printing process, an offset printing process, a slot-die coating process or an intaglio printing process.

5. A method of producing a multilayer element with a substrate and at least one conductor structure connected in an areal manner to the substrate, which has first regions of electrically conductive material, which is present in accordance with a prescribed pattern, while electrically non-conductive second regions lie between the first regions comprising:
    connecting a conductor foil to the substrate such that the conductor foil fully connects to the substrate in the first regions and a partial bonding contact between the substrate and the conductor foil is created at a multiplicity of bonding zones in laterally extended second regions;
    structuring the conductor foil by cutting the conductor foil along boundaries of the first regions so that, after cutting, contiguous pieces of foil are still attached to the substrate in the regions of the bonding zones; and
    removing contiguous pieces of foil of the conductor foil from the laterally extended second regions by releasing the partial bonding contact between the substrate and the conductor foil, wherein the conductor foil connects to the substrate by a layer of adhesive lying in between, and the adhesive layer is created such that the bonding zones in laterally extended second regions form a pattern of points or a pattern of lines and/or such that an area fraction of the bonding zones within the laterally extended second regions is 2% to 80%.

6. The method as claimed in claim 5, wherein, before connecting the conductor foil to the substrate, a laterally structured layer of adhesive is applied to the substrate or to the conductor foil, adhesive material being applied over a full surface area in the first regions and partially, in accordance with a prescribed pattern, in laterally extended second regions, to create the bonding zones, by a jet printing process or by a flexographic printing process.

7. The method as claimed in claim 5, wherein portions of register marks consisting of adhesive are created on the substrate simultaneously with application of adhesive, by a printing unit that applies the adhesive used at the same time for printing portions of the register marks.

8. The method as claimed in claim 5, wherein laser radiation is radiated in along the boundaries of the first regions for structuring the conductor foil by a laser machining system.

9. The method as claimed in claim 8, further comprising self-calibrating the laser machining system by:
creating at least one laser marking in the region of a register mark provided on the substrate;
detecting in a spatially resolving manner the region of the register mark and of the laser marking for determination of a relative deviation of the laser marking in relation to the register mark;
determining at least one deviation parameter representing the deviation of the laser marking in relation to the register mark; and
controlling the laser machining system while taking into account the deviation parameter.

10. The method as claimed in claim 5, wherein, after completion of the structuring operation, pieces of foil are removed from laterally extended second regions by a cleaning device in a cleaning operation, by the pieces of foil being transferred to an outer surface of a moving transporting element and detached from the bonding zones by the transporting element and transported away for further processing.

11. The method as claimed in claim 10, wherein the pieces of foil are sucked onto the outer surface by creating a negative pressure between the pieces of foil and the outer surface in a suction-attaching portion of the transporting element and detached from the bonding zones by the transporting element and transported away for further processing, the pieces of foil sucked onto the outer surface preferably being transported by the transporting element into the region of a releasing portion and actively released from the transporting element in the releasing portion by creating a positive pressure between the outer surface and the pieces.

12. A multilayer element produced by a method comprising:
connecting a conductor foil to a substrate such that the conductor foil fully connects to the substrate in first regions and a partial bonding contact between the substrate and the conductor foil is created at a multiplicity of bonding zones in laterally extended second regions;
structuring the conductor foil by cutting the conductor foil along boundaries of the first regions so that, after cutting, contiguous pieces of foil are still attached to the substrate in the regions of the bonding zones; and
removing contiguous pieces of foil of the conductor foil from the laterally extended second regions by releasing the partial bonding contact between the substrate and the conductor foil,
wherein the substrate and at least one conductor structure connected in an areal manner to the substrate by a layer of adhesive, the at least one conductor structure having first regions of electrically conductive material present on the layer of adhesive in accordance with a prescribed pattern, while electrically non-conductive second regions lie adjacent to first regions, while a multiplicity of bonding zones of the layer of adhesive are present in a distributed manner in accordance with a prescribed pattern in laterally extended second regions, the bonding zones in laterally extended second regions forming a pattern of points or a pattern of lines and/or wherein an area fraction of the bonding zones within the laterally extended regions of 2% to 80%.

* * * * *